(12) United States Patent
Lee et al.

(10) Patent No.: US 11,244,837 B2
(45) Date of Patent: Feb. 8, 2022

(54) PROCESS GAS SUPPLY APPARATUS AND WAFER TREATMENT SYSTEM INCLUDING THE SAME

(71) Applicant: SEMES CO., LTD., Chungcheongnam-do (KR)

(72) Inventors: Ki Yung Lee, Suwon-si (KR); Seung Bae Lee, Hwaseong-si (KR)

(73) Assignee: Semes Co., Ltd., Chungcheongnam-do (KR)

(*) Notice: Subject to any disclaimer, the term of this patent is extended or adjusted under 35 U.S.C. 154(b) by 0 days.

(21) Appl. No.: 16/902,771

(22) Filed: Jun. 16, 2020

(65) Prior Publication Data
US 2020/0402821 A1 Dec. 24, 2020

(30) Foreign Application Priority Data
Jun. 20, 2019 (KR) .......................... 10-2019-0073591

(51) Int. Cl.
*H01L 21/67* (2006.01)
*H01L 21/306* (2006.01)
*B01J 4/00* (2006.01)

(52) U.S. Cl.
CPC .. *H01L 21/67069* (2013.01); *H01L 21/30621* (2013.01); *B01J 4/001* (2013.01)

(58) Field of Classification Search
CPC ......... H01L 21/67103; H01L 21/30621; H01L 21/67109; H01L 21/67069; H01L 21/6831; H01J 37/3244; B01J 4/001
See application file for complete search history.

(56) References Cited

U.S. PATENT DOCUMENTS

| 5,888,907 A * | 3/1999 | Tomoyasu .......... H01J 37/3244 438/714 |
| 6,303,512 B1 | 10/2001 | Laermer et al. |
| 8,896,210 B2 | 11/2014 | Nishino et al. |
| 2015/0359079 A1* | 12/2015 | Sun ..................... H01J 37/3244 156/345.29 |

FOREIGN PATENT DOCUMENTS

| KR | 100531560 B1 | 2/2006 |
| KR | 20140105456 A | 9/2014 |
| KR | 20180014583 A * | 2/2018 |
| KR | 20180014583 A | 2/2018 |
| KR | 101963859 B1 | 3/2019 |

OTHER PUBLICATIONS

Korean Office Action for Korean Application No. 10-2019-0073591, dated Aug. 18, 2020, 4 pages.
Korean Notification of Reason for Refusal issued in Korean Patent Application No. 10-2021-0051537, dated May 6, 2021, with translation, 10 pages.

* cited by examiner

*Primary Examiner* — Yuechuan Yu
(74) *Attorney, Agent, or Firm* — RatnerPrestia

(57) ABSTRACT

Provided are a process gas supply apparatus which supplies a process gas onto a wafer to etch an oxide layer by dividing an edge zone into a first zone and a second zone located outside the first zone and dividing the second zone into a plurality of sub-zones and a wafer treatment system including the process gas supply apparatus.

9 Claims, 7 Drawing Sheets

[FIG. 1]
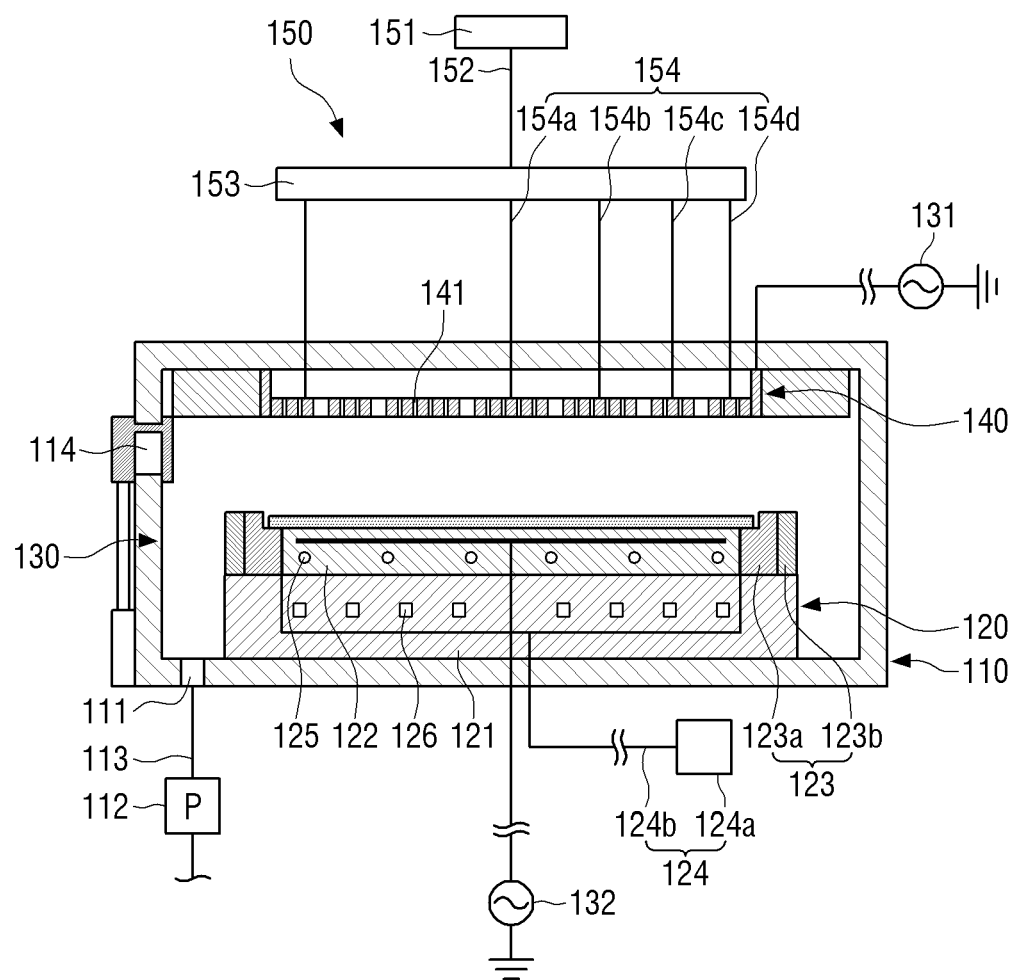

[FIG. 2]
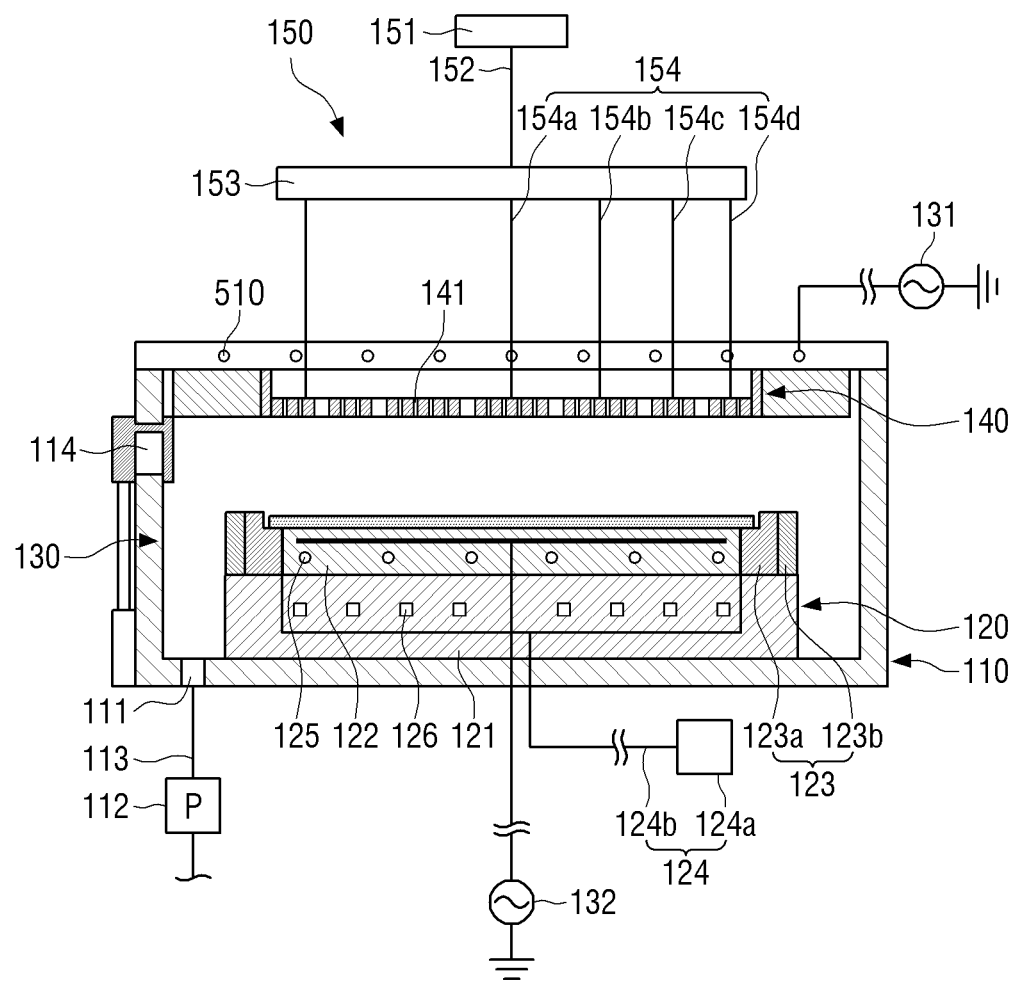

[FIG. 3]
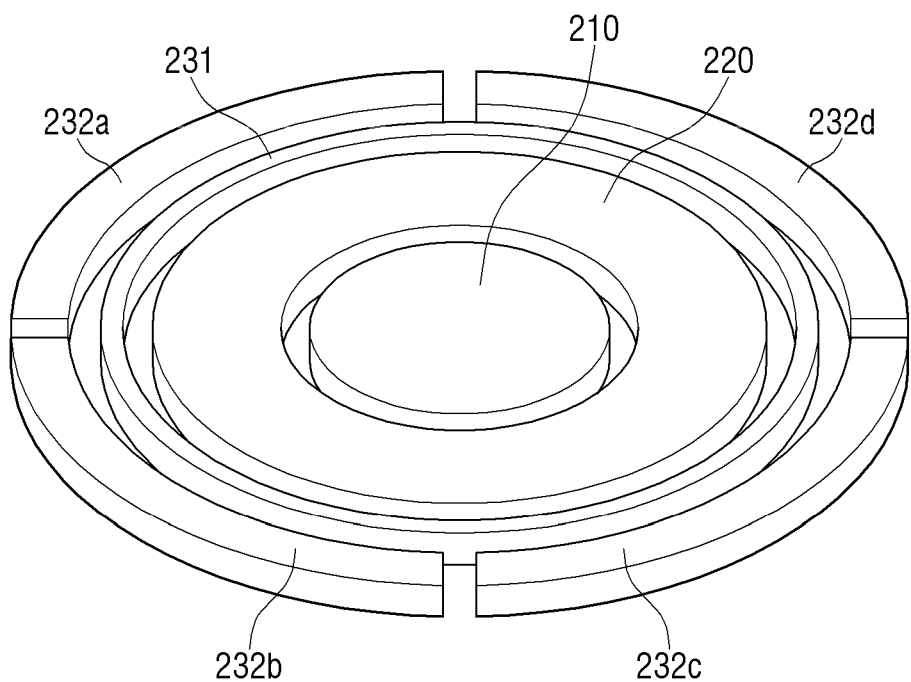
232: 232a, 232b, 232c, 232d
230: 232, 231

[FIG. 4A]
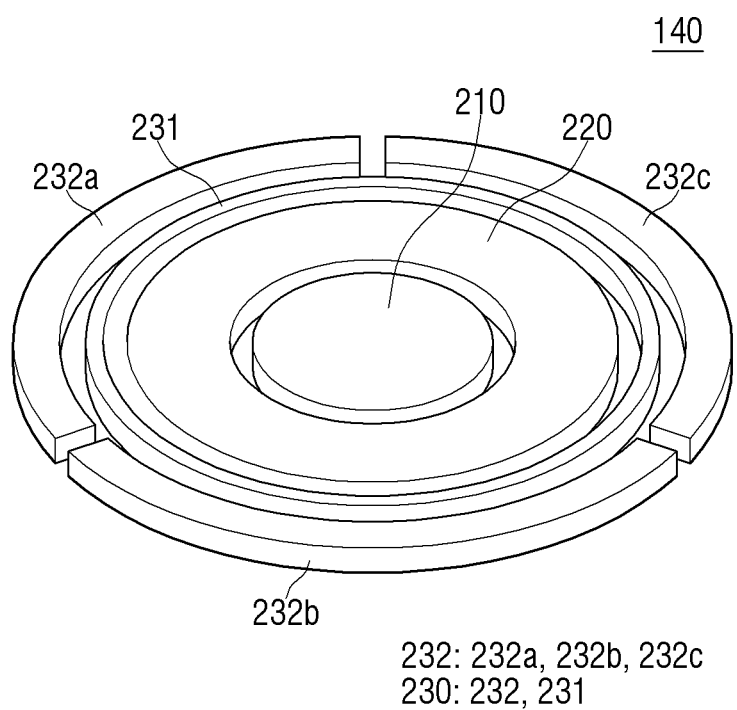

[FIG. 4B]
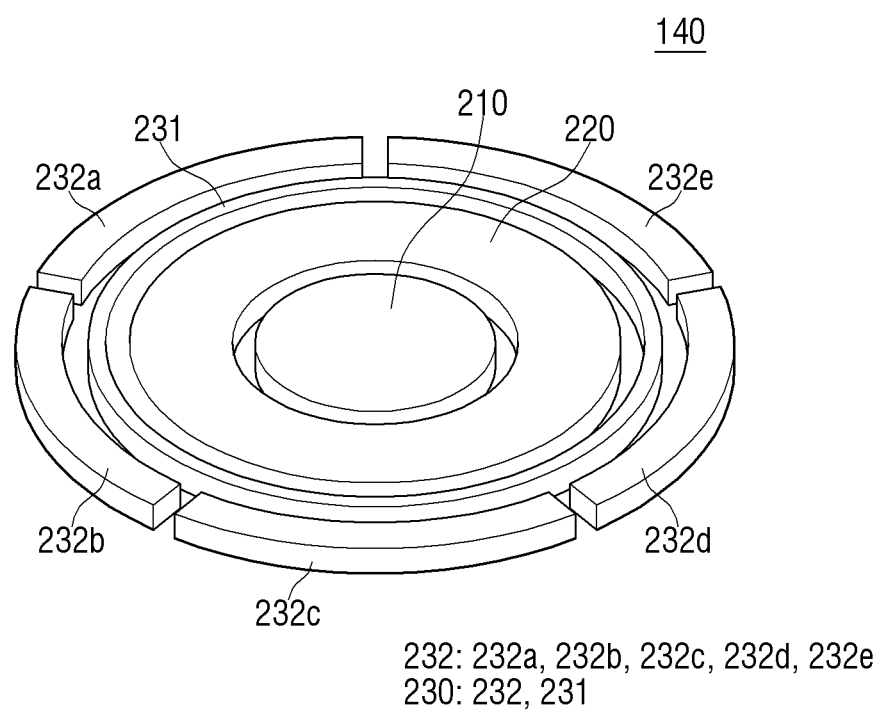
232: 232a, 232b, 232c, 232d, 232e
230: 232, 231

[FIG. 5]
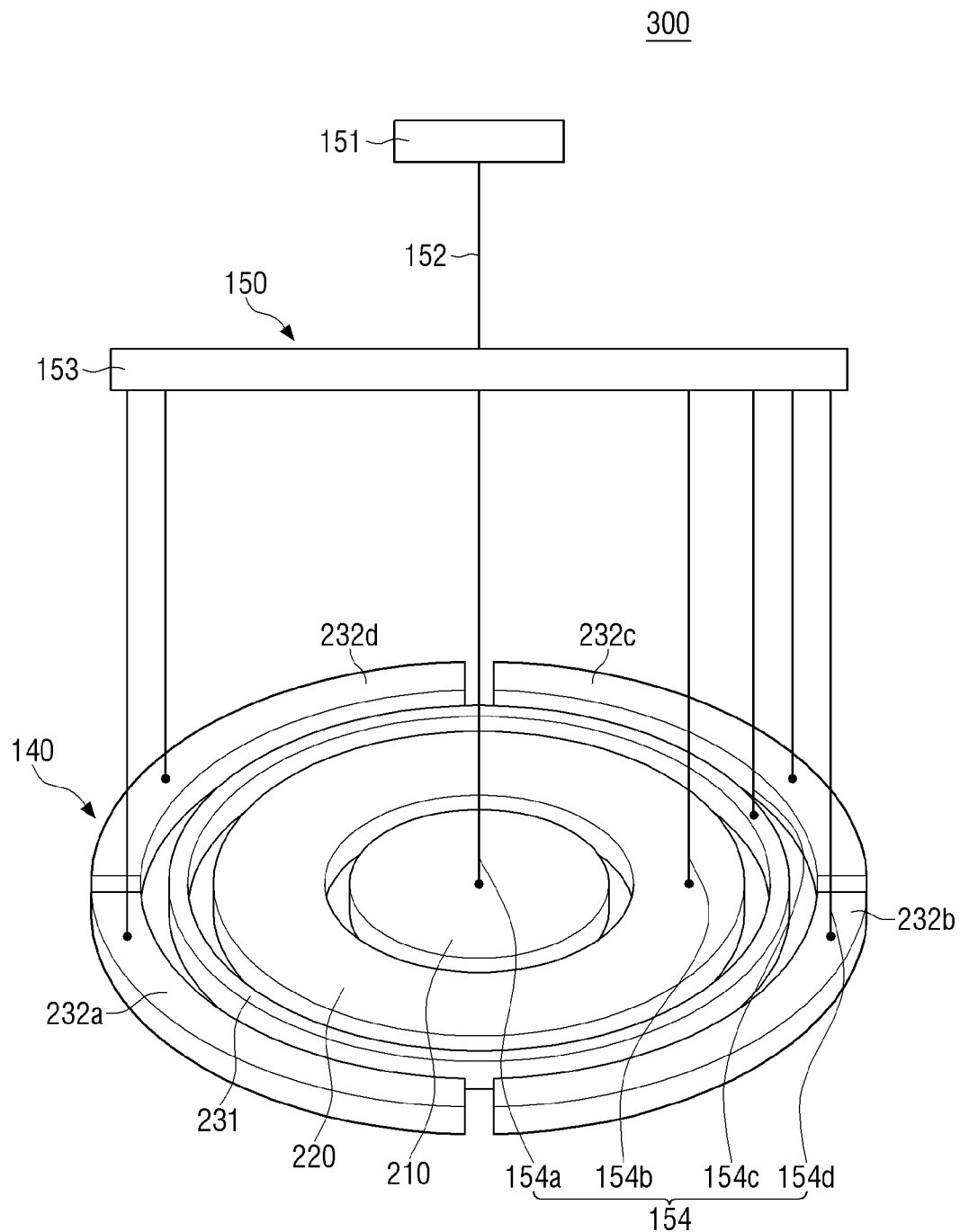

[FIG. 6]
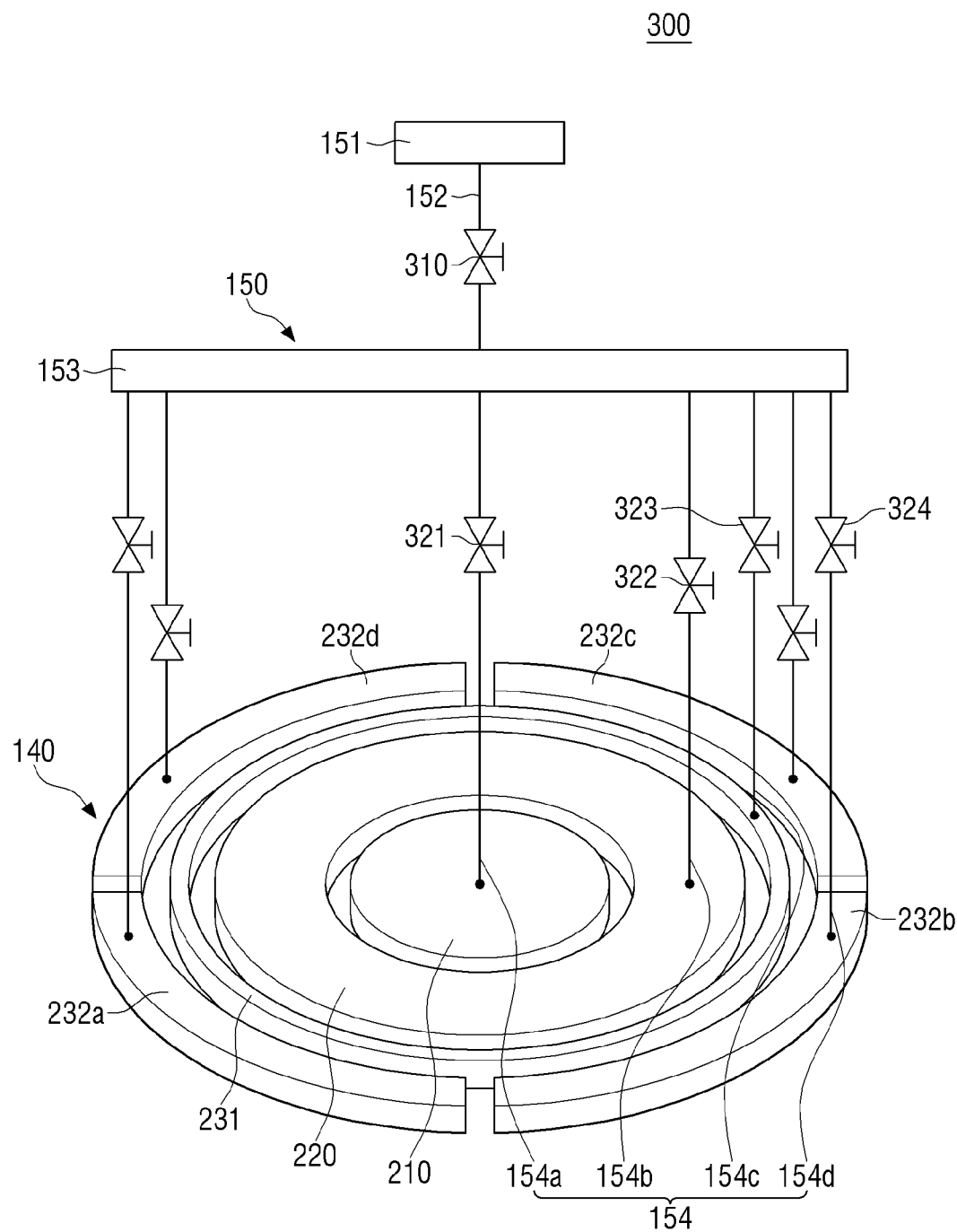
320: 321, 322, 323, 324

PROCESS GAS SUPPLY APPARATUS AND WAFER TREATMENT SYSTEM INCLUDING THE SAME

CROSS REFERENCE TO RELATED APPLICATION

This application claims the benefit of Korean Patent Application No. 10-2019-0073591, filed on Jun. 20, 2019, in the Korean Intellectual Property Office, the disclosure of which is incorporated herein by reference in its entirety.

BACKGROUND

1. Field

The present disclosure relates to an apparatus for supplying a process gas and a system for treating a wafer using the apparatus, and more particularly, to an apparatus for supplying a process gas to etch an oxide layer and a system for treating a wafer using the apparatus.

2. Description of the Related Art

Examples of an etching process used to manufacture a semiconductor device include a wet-etching process and a dry-etching process. Recently, as semiconductor devices have been ultra-miniaturized for application to small electronic products, the dry-etching process capable of fine patterning has been widely used.

A semiconductor device manufacturing facility includes a shower head for supplying a process gas to perform a dry-etching process inside a process chamber.

To etch an oxide layer on a wafer, the shower head supplies a process gas by dividing an upper zone of the wafer into a center zone, a middle zone, and an edge zone.

However, since patterns formed on the wafer are fine, the problem of local dispersion asymmetry may occur on the wafer.

SUMMARY

Aspects of the present disclosure provide a process gas supply apparatus which supplies a process gas onto a wafer to etch an oxide layer by dividing an edge zone into a first zone and a second zone located outside the first zone and dividing the second zone into a plurality of sub-zones.

Aspects of the present disclosure also provide a wafer treatment system including a process gas supply apparatus which supplies a process gas onto a wafer by dividing an edge zone into a first zone and a second zone located outside the first zone and dividing the second zone into a plurality of sub-zones.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a process gas supply apparatus including: a shower head installed inside a chamber in which an etching process is performed and having a plurality of gas feeding holes through which a process gas passes; and a gas supply unit installed outside the chamber, connected to the shower head, and supplying the process gas into the chamber through the gas feeding holes, wherein the shower head includes: a flat plate-shaped center part; a ring-shaped middle part which surrounds the center part; a ring-shaped first edge part which surrounds the middle part; and a ring-shaped second edge part which surrounds the first edge part and is divided into a plurality of sub-parts.

The gas supply unit may include: a gas supply source which provides the process gas; a gas distributor which distributes the process gas; a gas supply line which connects the gas supply source and the gas distributor; and gas distribution lines which connect the gas distributor and the center part, the gas distributor and the middle part, the gas distributor and the first edge part, and the gas distributor and the second edge part, respectively.

The number of gas distribution lines connecting the gas distributor and the second edge part may be the same as the number of sub-parts of the second edge part.

The process gas supply apparatus may further include: distribution control valves which control the flow of the process gas flowing through the gas distribution lines; and a valve controller which controls the distribution control valves.

The second edge part may be wider than the first edge part.

According to another aspect of the present disclosure, there is provided a wafer treatment system including: a chamber in which an etching process is performed; an electrostatic chuck which is installed inside the chamber and on which a wafer is mounted; a shower head which is installed inside the chamber to face the electrostatic chuck in a vertical direction and has a plurality of gas feeding holes through which a process gas passes; and a gas supply unit which is installed outside the chamber, is connected to the shower head, and supplies the process gas into the chamber through the gas feeding holes, wherein the shower head includes: a flat plate-shaped center part; a ring-shaped middle part which surrounds the center part; a ring-shaped first edge part which surrounds the middle part; and a ring-shaped second edge part which surrounds the first edge part and is divided into a plurality of sub-parts, wherein the shower head functions as an upper electrode, and the electrostatic chuck functions as a lower electrode.

According to another aspect of the present disclosure, there is provided a wafer treatment system including: a chamber in which an etching process is performed; an electrostatic chuck which is installed inside the chamber and on which a wafer is mounted; a shower head which is installed inside the chamber to face the electrostatic chuck in a vertical direction and has a plurality of gas feeding holes through which a process gas passes; a gas supply unit which is installed outside the chamber, is connected to the shower head, and supplies the process gas into the chamber through the gas feeding holes; and an antenna which is installed in an upper part of the chamber and equipped with a spiral coil, wherein the shower head includes: a flat plate-shaped center part; a ring-shaped middle part which surrounds the center part; a ring-shaped first edge part which surrounds the middle part; and a ring-shaped second edge part which surrounds the first edge part and is divided into a plurality of sub-parts, wherein the antenna functions as an upper electrode, and the electrostatic chuck functions as a lower electrode.

BRIEF DESCRIPTION OF THE DRAWINGS

These and/or other aspects will become apparent and more readily appreciated from the following description of the embodiments, taken in conjunction with the accompanying drawings in which:

FIG. 1 is a cross-sectional view illustrating the schematic structure of a wafer treatment system according to an embodiment of the present disclosure;

FIG. 2 is a cross-sectional view illustrating the schematic structure of a wafer treatment system according to an embodiment of the present disclosure;

FIG. 3 illustrates an embodiment of the structure of a shower head included in the wafer treatment system of FIG. 1;

FIGS. 4A and 4B illustrate embodiments of the structure of the shower head included in the wafer treatment system of FIG. 1;

FIG. 5 is a conceptual diagram schematically illustrating the structure of a process gas supply apparatus according to an embodiment of the present disclosure; and FIG. 6 is a conceptual diagram schematically illustrating the structure of a process gas supply apparatus according to an embodiment of the present disclosure.

DETAILED DESCRIPTION

Hereinafter, exemplary embodiments of the present disclosure will be described in greater detail with reference to the attached drawings. Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the invention to those skilled in the art, and the present disclosure will only be defined by the appended claims. Like reference numerals refer to like elements throughout the specification.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present.

Spatially relative terms, such as "below," "beneath," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" or "beneath" can encompass both an orientation of above and below. The device may be otherwise oriented and the spatially relative descriptors used herein interpreted accordingly.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described in detail with reference to the attached drawings. In the following description with reference to the attached drawings, like or corresponding elements will be indicated by like reference numerals, and a redundant description thereof will be omitted.

As semiconductor devices are finely patterned, there is a need for a critical dimension (CD) dispersion control technology for an edge zone, in particular, an extreme edge zone of a wafer.

In addition, the technical demand for a control knob is increasing for the problem of dispersion asymmetry that occurs locally on the wafer.

In the present disclosure, the edge zone is divided into a first zone and a second zone located outside the first zone, and the second zone is divided into a plurality of sub-zones to supply a process gas for etching an oxide layer on the wafer.

Thus, in the present disclosure, it is possible to finely control a local CD gradient on the wafer and improve CD dispersion in the edge zone, in particular, the extreme edge zone.

The present disclosure will now be described in detail with reference to the drawings.

FIG. 1 is a cross-sectional view illustrating the schematic structure of a wafer treatment system 100 according to an embodiment of the present disclosure.

Referring to FIG. 1, the wafer treatment system 100 may include a chamber 110, a support unit 120, a plasma generation unit, a shower head 140, and a gas supply unit 150.

The wafer treatment system 100 is a system for treating a wafer W by dry-etching the wafer W. The wafer treatment system 100 may etch an oxide layer on the wafer W. The wafer treatment system 100 may etch the oxide layer on the wafer W by using, for example, plasma.

The chamber 110 provides a space in which an etching process is performed. The chamber 110 may include am exhaust hole 111 at its bottom.

The exhaust hole 111 may be connected to an exhaust line 113 on which a pump 112 is mounted. The exhaust hole 111 may discharge reaction byproducts generated in an etching process and gas remaining inside the chamber 110 to the outside of the chamber 110 through the exhaust line 113. In this case, the space inside the chamber 110 may be depressurized to a predetermined pressure level.

The chamber 110 may have an opening 114 formed in its sidewall. The opening 114 functions as a passage through which the wafer W is inserted into and removed from the chamber 110. The opening 114 may be opened and closed by a door assembly (not illustrated).

The door assembly may include an outer door (not illustrated), an inner door (not illustrated), and a connecting plate (not illustrated).

The outer door is provided on an outer wall of the chamber 110. The outer door may be moved up and down by a door driver (not illustrated). The door driver may include a pneumatic cylinder, a motor, etc.

The inner door is provided on an inner wall of the chamber 110.

The connecting plate is provided to extend from the inside to the outside of the chamber 110. The outer door and the inner door may be coupled and fixed to each other by the connecting plate.

The support unit 120 is installed in a lower area of the inside of the chamber 110. The support unit 120 may support the wafer W using electrostatic force. However, the current embodiment is not limited thereto. The support unit 120 may also support the wafer W using various methods such as mechanical clamping, vacuum, and the like.

When the support unit 120 supports the wafer W using electrostatic force, it may include a base 121 and an electrostatic chuck 122.

The electrostatic chuck 122 supports the wafer W mounted thereon by using electrostatic force. The electrostatic chuck 122 may be made of a ceramic material and coupled to the base 121 such that it is fixed on the base 121.

The electrostatic chuck 122 may be installed to be movable up and down inside the chamber 110 by using a driving member (not illustrated). When the electrostatic chuck 122 is formed to be movable up and down, it may be possible to position the wafer W in an area showing a more uniform plasma distribution.

A ring assembly 123 is provided to cover the rim of the electrostatic chuck 122. The ring assembly 123 may be provided in a ring shape and configured to support an edge zone of the wafer W.

The ring assembly 123 may include a focus ring 123a and an insulating ring 123b.

The focus ring 123a is formed inside the insulating ring 123b and surrounds the electrostatic chuck 122. The focus ring 123a focuses plasma on the wafer W. The focus ring 123a may be made of a silicon material.

The insulating ring 123b is formed outside the focus ring 123a and surrounds the focus ring 123a. The insulating ring 123b may be made of a quartz material.

The ring assembly 123 may further include an edge ring (not illustrated) formed in close contact with the rim of the focus ring 123a. The edge ring is designed to prevent side surfaces of the electrostatic chuck 122 from being damaged by plasma.

A gas provision unit 124 supplies gas to remove foreign substances remaining on the ring assembly 123 or an edge portion of the electrostatic chuck 122. The gas provision unit 124 may supply nitrogen (N2) gas as a gas for removing foreign substances. However, the current embodiment is not limited thereto. The gas provision unit 124 may also supply other gases or cleansing agents.

The gas provision unit 124 may include a gas provision source 124a and a provision line 124b.

The provision line 124b is provided between the ring assembly 123 and the electrostatic chuck 122. The provision line 124b may be connected, for example, between the focus ring 123a and the electrostatic chuck 122. However, the current embodiment is not limited thereto. The provision line 124b may also be provided inside the focus ring 123a and bent to be connected between the focus ring 123a and the electrostatic chuck 122.

A heating member 125 and a cooling member 126 are provided to maintain a process temperature of the wafer W while an etching process is performed inside the chamber 110. To this end, the heating member 125 and the cooling member 126 may respectively be provided as hot wires and cooling lines through which a refrigerant flows.

The heating member 125 and the cooling member 126 may be installed inside the support unit 120 to maintain the process temperature of the wafer W. For example, the heating ember 125 may be installed inside the electrostatic chuck 122, and the cooling member 126 may be installed inside the base 121.

The plasma generation unit generates plasma from a gas remaining in a discharge space. Here, the discharge space refers to a space located above the support unit 120 in the internal space of the chamber 110.

The plasma generation unit may generate plasma in the discharge space inside the chamber 110 by using a capacitively coupled plasma (CCP) source. In this case, the plasma generation unit may use the shower head 140 as an upper electrode and the electrostatic chuck 122 as a lower electrode.

However, the current embodiment is not limited thereto. The plasma generation unit may also generate plasma in the discharge space inside the chamber 110 by using an inductively coupled plasma (ICP) source. In this case, the plasma generation unit may use a spiral antenna installed in an upper part of the chamber 110 as illustrated in FIG. 2 as an upper electrode and the electrostatic chuck 122 as a lower electrode.

FIG. 2 is a cross-sectional view illustrating the schematic structure of a wafer treatment system 100 according to an embodiment of the present disclosure. FIG. 2 will be described later.

The plasma generation unit may include an upper electrode, a lower electrode, an upper power source 131, and a lower power source 132.

As described above, when the plasma generation unit uses a CCP source, the shower head 140 may function as the upper electrode, and the electrostatic chuck 122 may function as a lower electrode.

The shower head 140 functioning as the upper electrode and the electrostatic chuck 122 functioning as the lower electrode may be installed inside the chamber 110 to face each other in a vertical direction. The shower head 140 may include a plurality of gas feeding holes 141 to spray gas into the chamber 110 and may have a diameter greater than that of the electrostatic chuck 122. The shower head 140 may be made of a silicon material or a metal material.

The upper power source 131 applies power to the upper electrode, that is, the shower head 140. The upper power source 131 may be provided to control plasma characteristics. The upper power source 131 may be provided to control, for example, ion bombardment energy.

When the upper power source 131 is provided in plural numbers, a first matching network (not illustrated) electrically connected to the upper power sources may be further included. The first matching network may match frequency powers of different magnitudes received respectively from the upper power sources and apply them to the shower head 140.

A first impedance matching circuit (not illustrated) may be provided on a transmission line connecting the upper power source 131 and the shower head 140 for the purpose of impedance matching. The first impedance matching circuit may act as a lossless passive circuit to effectively (i.e., to the maximum) transfer electrical energy from the upper power source 131 to the shower head 140.

The lower power source 132 applies power to the lower electrode, that is, the electrostatic chuck 122. The lower power source 132 may serve as a plasma source for generating plasma or may control plasma characteristics together with the upper power source 131.

When the lower power source 132 is provided in plural numbers, a second matching network (not illustrated) electrically connected to the lower power sources may be further included. The second matching network may match frequency powers of different magnitudes received respectively from the lower power sources and apply them to the electrostatic chuck 122.

A second impedance matching circuit (not illustrated) may be provided on a transmission line connecting the lower power source 132 and the electrostatic chuck 122 for the purpose of impedance matching. The second impedance matching circuit may act as a lossless passive circuit to effectively (i.e., to the maximum) transfer electrical energy from the lower power source 132 to the electrostatic chuck 122.

The shower head 140 may be divided into three zones, i.e., a center zone, a middle zone, and an edge zone in a horizontal direction as illustrated in FIG. 3.

Here, the edge zone may be divided into a first zone located inside (i.e., close to the center zone) and a second zone (an extreme edge or ex-edge zone) located outside (i.e., far from the center zone), and the second zone may be divided into a plurality of sub-zones.

FIG. 3 illustrates an embodiment of the structure of the shower head 140 included in the wafer treatment system 100 of FIG. 1. The following description will be given with reference to FIG. 3.

The shower head 140 may include a center part 210, a middle part 220, and an edge part 230. Here, the edge part 230 may include a first edge part 231 and a second edge part 232. However, the current embodiment is not limited thereto. The shower head 140 may also include only the center part 210 and the edge part 230.

The center part 210 may be located in the center zone of the shower head 140 and may include a plurality of gas feeding holes 141.

The center part 210 may be installed inside the chamber 110 to face a center zone of the electrostatic chuck 122. That is, the center part 210 may be provided such that the gas sprayed and plasma excited through the center part 210 mainly reach a center zone of the wafer W mounted on the electrostatic chuck 122.

The center part 210 may be provided as a thin circular (or oval) plate. The center part 210 may be provided to have a width of 110 mm (0 mm to 110 mm based on a center of the shower head 140).

The middle part 220 may be located in the middle zone of the shower head 140 and, like the center part 210, may include a plurality of gas feeding holes 141.

The middle part 220 may be installed inside the chamber 110 to face a middle zone of the electrostatic chuck 122. That is, the middle part 220 may be provided such that the gas sprayed and plasma excited through the middle part 220 mainly reach a middle zone of the wafer W mounted on the electrostatic chuck 122.

The middle part 220 may have the same center as that of the center part 210, and a diameter of the middle part 220 may be greater than that of the center part 210. That is, the middle part 220 may be provided as a ring-shaped thin plate disposed in a radial direction to surround the center part 210.

The middle part 220 may be provided to have a smaller width than the center part 210. The middle part 220 may be provided to have a width of, e.g., 94 mm (131 mm to 225 mm based on the center of the shower head 140). However, the current embodiment is not limited thereto. The middle part 220 may also be provided to have the same width as the center part 210 or provided to have a greater width than the center part 210.

The middle part 220 may be provided to have a larger area than the center part 210. In this case, the middle part 220 may include a larger number of gas feeding holes 141 than the center part 210. However, the current embodiment is not limited thereto. The middle part 220 may also be provided to have the same area as the center part 210 or provided to have a smaller area than the center part 210. In this case, the middle part 220 may include the same number of gas feeding holes 141 as the center part 210 or a smaller number of gas feeding holes 141 than the center part 210.

The edge part 230 may be located in the edge zone of the shower head 140 and, like the center part 210 and the middle part 220, may include a plurality of gas feeding holes 141.

The edge part 230 may be installed inside the chamber 110 to face an edge zone of the electrostatic chuck 122. That is, the edge part 230 may be provided such that the gas sprayed and plasma excited through the edge part 230 mainly reach an edge zone of the wafer W mounted on the electrostatic chuck 122.

The edge part 230 may have the same center as that of the center part 210, and a diameter of the edge part 230 may be greater than that of the middle part 220. That is, the edge part 230 may be provided as a ring-shaped thin plate disposed in the radial direction to surround the middle part 220. The edge part 230 may include the first edge part 231 formed adjacent to the middle part 220 and the second edge part 232 formed outside the first edge part 231. When the edge part 230 includes the first edge part 231 and the second edge part 232, it may be provided to have a smaller width than the center part 210 and the middle part 220. However, the current embodiment is not limited thereto. The edge part 230 may also be provided to have the same width as the center part 210 and the middle part 220 or provided to have a greater width than at least one of the center part 210 and the middle part 220.

In addition, when the edge part 230 includes the first edge part 231 and the second edge part 232, it may be provided to have a larger area than the center part 210 and the middle part 220. In this case, the edge part 230 may include a larger number of gas feeding holes 141 than the center part 210 and the middle part 220. However, the current embodiment is not limited thereto. The edge part 230 may also be provided to have the same area as the center part 210 and the middle part 220. In this case, the edge part 230 may include the same number of gas feeding holes 141 as the center part 210 and the middle part 220.

Alternatively, the edge part 230 may be provided to have a smaller area than at least one of the center part 210 and the middle part 220. In this case, the edge part 230 may include a smaller number of gas feeding holes 141 than at least one of the center part 210 and the middle part 220.

The first edge part 231 may be provided to have a smaller width than the second edge part 232. The first edge part 231 may be provided to have a width of, e.g., 16 mm (247 mm to 263 mm based on the center of the shower head 140), and the second edge part 232 may be provided to have a width of, e.g., 42 mm (287 mm to 329 mm based on the center of the shower head 140). However, the current embodiment is not limited thereto. The first edge part 231 may also be provided to have the same width as the second edge part 232 or provided to have a greater width than the second edge part 232.

The second edge part 232 may include a plurality of sub-parts. In this case, the sub-parts may be respectively located in the sub-zones into which the second zone is divided. The second edge part 232 may include, for example, four sub-parts, i.e., a first sub-part 232*a*, a second sub-part 232*b*, a third sub-part 232*c*, and a fourth sub-part 232*d*.

However, the current embodiment is not limited thereto. The second edge part 232 may also include three sub-parts, i.e., a first sub-part 232*a*, a second sub-part 232*b* and a third sub-part 232*c* as illustrated in FIG. 4A or include five sub-parts, i.e., a first sub-part 232*a*, a second sub-part 232*b*, a third sub-part 232*c*, a fourth sub-part 232*d* and a fifth sub-part 232*e* as illustrated in FIG. 4B. FIGS. 4A and 4B illustrate embodiments of the structure of the shower head 140 included in the wafer treatment system 100 of FIG. 1.

When the second edge part 232 includes a plurality of sub-parts, the sub-parts may be provided to have the same length. However, the current embodiment is not limited thereto. The sub-parts may also be provided to have different lengths. Alternatively, some of the sub-parts may be provided to have the same length, and the others may be provided to have different lengths.

When the second edge part 232 includes a plurality of sub-parts, the sub-parts may be provided to have the same width. However, the current embodiment is not limited thereto. The sub-parts may also be provided to have different widths. Alternatively, some of the sub-parts may be provided to have the same width, and the others may be provided to have different widths.

When the second edge part 232 includes a plurality of sub-parts, the sub-parts may be provided to have the same area. In this case, the sub-parts may include the same number of gas feeding holes 141. However, the current embodiment is not limited thereto. The sub-parts may also be provided to have different areas. In this case, the sub-parts may include different numbers of gas feeding holes 141.

Alternatively, some of the sub-parts may be provided to have the same length, and the others may be provided to have different lengths. In this case, some of the sub-parts may include the same number of gas feeding holes 141, and the others may include different numbers of gas feeding holes 141.

In the current embodiment, each of the center part 210, the middle part 220, and the first edge part 231 of the edge part 230 may also be divided into a plurality of sub-parts, like the second edge part 232 of the edge part 230.

Referring again to FIG. 1, the gas supply unit 150 supplies a process gas into the chamber 110 through the shower head 140. The gas supply unit 150 may include a first gas supply source 151, a gas supply line 152, a gas distributor 153, and gas distribution lines 154.

The first gas supply source 151 supplies an etching gas used to treat the wafer W. The first gas supply source 151 may supply a gas containing a fluorine component as the etching gas. For example, the first gas supply source 151 may supply a gas such as $SF_6$ or $CF_4$ as the etching gas.

A single first gas supply source 151 may be provided to supply the etching gas to the shower head 140. However, the current embodiment is not limited thereto. A plurality of first gas supply sources 151 may also be provided to supply the etching gas to the shower head 140.

The gas supply unit 150 may further include a second gas supply source (not illustrated) for supplying a deposition gas.

The second gas supply source supplies the deposition gas to the shower head 140 so as to protect side surfaces of a wafer pattern to enable anisotropic etching. The second gas supply source may supply a gas such as $C_4F_8$ or $C_2F_4$ as the deposition gas.

The gas supply line 152 connects the first gas supply source 151 and the gas distributor 153. The gas supply line 152 may transfer gas from the first gas supply source 151 to the gas distributor 153.

The gas distributor 153 distributes the etching gas supplied from the first gas supply source 151 to the shower head 140. The gas distributor 153 may distribute the etching gas to each part of the shower head 140, i.e., the center part 210, the middle part 220, the first edge part 231 of the edge part 230, and the second edge part 232 of the edge part 230.

When the gas distributor 153 distributes the etching gas to each part 210, 220, 231 or 232 of the shower head 140, it may distribute the same amount of etching gas to each part 210, 220, 231 or 232 of the shower head 140. However, the current embodiment is not limited thereto. When the gas distributor 153 distributes the etching gas to each part 210, 220, 231 or 232 of the shower head 140, it may also distribute a different amount of etching gas to each part 210, 220, 231 and 232 of the shower head 140.

Alternatively, the gas distributor 153 may distribute the same amount of etching gas to some parts of the shower head 140 and distribute different amounts of etching gas to the other parts of the shower head 140.

When the etching gas is supplied from the first gas supply source 151 and the deposition gas is supplied from the second gas supply source, the gas distributor 153 may distribute a mixed gas obtained by mixing the etching gas and the deposition gas to each part 210, 220, 231 or 232 of the shower head 140.

The gas distribution lines 154 connect the gas distributor 153 and the shower head 140. The gas distribution lines 154 may transfer gas from the gas distributor 153 to the shower head 140.

The gas distributor 153 may be individually connected to each part 210, 220, 231 or 232 of the shower head 140 through the gas distribution lines 154. In this case, the gas distribution lines 154 may include a first distribution line 154*a*, a second distribution line 154*b*, a third distribution line 154*c*, and a fourth distribution line 154*d* as illustrated in FIG. 5.

FIG. 5 is a conceptual diagram schematically illustrating the structure of a process gas supply apparatus 300 according to an embodiment of the present disclosure.

Referring to FIG. 5, the process gas supply apparatus 300 may include a shower head 140 and a gas supply unit 150.

The shower head 140 may include a center part 210, a middle part 220, a first edge part 231 of an edge part 230, and four second edge parts 232 of the edge part 230, that is, a first second part 232*a*, a second part 232*b*, a third second part 232*c*, and a fourth second part 232*d*.

A gas supply unit 150 may include a first gas supply source 151, a gas supply line 152, a gas distributor 153, and four gas distribution lines 154, that is, a first distribution line 154*a*, a second distribution line 154*b*, a third distribution line 154*c* and a fourth distribution line 154*d*.

The first distribution line 154*a* connects the gas distributor 153 and the center part 210 of the shower head 140. The first distribution line 154*a* may allow a gas distributed by the gas distributor 153 to be supplied into a chamber 110 through the center part 210 of the shower head 140.

The second distribution line 154*b* connects the gas distributor 153 and the middle part 220 of the shower head 140. The second distribution line 154*b* may allow the gas distributed by the gas distributor 153 to be supplied into the chamber 110 through the middle part 220 of the shower head 140.

The third distribution line 154*c* connects the gas distributor 153 and the first edge part 231 of the edge part 230 of the shower head 140. The third distribution line 154*c* may allow the gas distributed by the gas distributor 153 to be supplied into the chamber 110 through the first edge part 231 of the shower head 140.

The fourth distribution line 154*d* connects the gas distributor 153 and the second edge parts 232 of the edge part 230 of the shower head 140. The fourth distribution line 154*d* may allow the gas distributed by the gas distributor 153 to be supplied into the chamber 110 through the second edge parts 232 of the shower head 140.

The fourth distribution line 154*d* may be provided in plural numbers. The number of fourth distribution lines 154*d* may be the same as the number of second edge parts 232. In this case, the fourth distribution lines 154*d* may connect the gas distributor 153 and the second edge parts 232 of the shower head 140 in a one-to-one manner.

However, the current embodiment is not limited thereto. A smaller number of fourth distribution lines 154*d* than the number of second edge parts 232 may be provided to connect the gas distributor 153 and the second edge parts 232 of the shower head 140 in a one-to-many manner.

The process gas supply apparatus 300 may further include a supply control valve 310, distribution control valves 320, and a valve controller as illustrated in FIG. 6. FIG. 6 is a conceptual diagram schematically illustrating the structure of a process gas supply apparatus 300 according to an embodiment of the present disclosure. The following description will be given with reference to FIG. 6.

The supply control valve 310 may be installed on a gas supply line 152 to control the flow of gas flowing through the gas supply line 152. The supply control valve 310 may turn on or off the supply of the gas flowing through the gas supply line 152 or may control a flow rate of the gas flowing through the gas supply line 152.

The distribution control valves 320 may be installed on gas distribution lines 154 to control the flow of gas flowing through the gas distribution lines 154. The distribution control valves 320 may turn on or off the supply of the gas flowing through the gas distribution lines 154 or may control a flow rate of the gas flowing through the gas distribution lines 154.

The distribution control valves 320 may include four control valves, that is, a first control valve 321, a second control valve 322, a third control valve 323, and a fourth control valve 324.

The first control valve 321 may be installed on a first distribution line 154*a* to control the flow of gas flowing through the first distribution line 154*a*.

The second control valve 322 may be installed on a second distribution line 154*b* to control the flow of gas flowing through the second distribution line 154*b*.

The third control valve 323 may be installed on a third distribution line 154*c* to control the flow of gas flowing through the third distribution line 154*c*.

The fourth control valve 324 may be installed on a fourth distribution line 154*d* to control the flow of gas flowing through the fourth distribution line 154*d*.

The valve controller controls the supply control valve 310 and the distribution control valves 320. The valve controller may control each of the supply control valve 310 and the distribution control valves 320 independently.

The valve controller may control the distribution control valves 320, i.e., the first control valve 321, the second control valve 322, the third control valve 323 and the fourth control valve 324 to supply the same amount of gas to each part 210, 220, 231 or 232 of a shower head 140.

However, the current embodiment is not limited thereto. The valve controller may also control the first control valve 321, the second control valve 322, the third control valve 323 and the fourth control valve 324 to supply a different amount of gas to each part 210, 220, 231 or 232 of the shower head 140. In this case, the valve controller may control the first control valve 321, the second control valve 322, the third control valve 323 and the fourth control valve 324 to supply a different amount of gas to each part 210, 220, 231 or 232 of the shower head 140 based on an etching rate of each zone of a wafer W corresponding to each part 210, 220, 231 or 232 of the shower head 140.

Alternatively, the valve controller may control the first control valve 321, the second control valve 322, the third control valve 323 and the fourth control valve 324 to supply the same amount of gas to some parts of the shower head 140 and supply different amounts of gas to the other parts of the shower head 140. In this case, the valve controller may also allow the same amount of gas to be supplied to some parts of the shower head 140 and different amounts of gas to be supplied to the other parts of the shower head 140 based on the etching rate of each zone of the wafer W corresponding to each part 210, 220, 231 or 232 of the shower head 140.

In FIG. 6, the process gas supply apparatus 300 includes all of the supply control valve 310 and the distribution control valves 320. However, the current embodiment is not limited thereto. The process gas supply apparatus 300 may also include any one of the supply control valve 310 and the distribution control valves 320.

As described above, when the plasma generation unit uses a CCP source, the wafer treatment system 100 may be implemented as illustrated in FIG. 1.

A wafer treatment system 100 when the plasma generation unit uses an ICP source will now be described.

Only differences between the wafer treatment system 100 of FIG. 2 and the wafer treatment system 100 of FIG. 1 will be described below.

A spiral antenna 510 may be equipped with a coil provided to form a closed loop and may be installed in an upper part of a chamber 110. The spiral antenna 510 generates a magnetic field and an electric field inside the chamber 110 based on power supplied from an upper power source 131 to excite gas, which is introduced into the chamber 110 through a shower head 140, into plasma.

The spiral antenna 510 may be equipped with a planar spiral coil. However, the current embodiment is not limited thereto. The structure or size of the coil can be variously changed by those of ordinary skill in the art.

Alternatively, the spiral antenna 510 may be installed outside the chamber 110 (e.g., above the upper part of the chamber 110).

While the present disclosure has been particularly shown and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A process gas supply apparatus comprising:
a shower head installed inside a chamber in which an etching process is performed and having a plurality of gas feeding holes through which a process gas passes; and
a gas supply unit installed outside the chamber, connected to the shower head, and supplying the process gas into the chamber through the gas feeding holes,
wherein the shower head comprises:
a disc-shaped center part;
a ring-shaped middle part which surrounds the center part;
a ring-shaped first edge part which surrounds the middle part; and
a ring-shaped second edge part which surrounds the first edge part and is divided into a plurality of sub-parts,
wherein a width from an inner radial edge of the second edge part to an outer radial edge of the second edge part is greater than a width from an inner radial edge of the first edge part to an outer radial edge of the first edge part.

2. The apparatus of claim 1, wherein the gas supply unit comprises:
a gas supply source which provides the process gas;
a gas distributor which distributes the process gas;
a gas supply line which connects the gas supply source and the gas distributor; and
gas distribution lines which connect the gas distributor and the center part, the gas distributor and the middle part, the gas distributor and the first edge part, and the gas distributor and the second edge part, respectively.

3. The apparatus of claim 2, wherein the number of gas distribution lines connecting the gas distributor and the second edge part is the same as the number of sub-parts of the second edge part.

4. The apparatus of claim 2, further comprising:
distribution control valves which control the flow of the process gas flowing through the gas distribution lines; and
a valve controller which controls the distribution control valves.

5. A wafer treatment system comprising:
a chamber in which an etching process is performed;
an electrostatic chuck which is installed inside the chamber and on which a wafer is mounted;
a shower head which is installed inside the chamber to face the electrostatic chuck in a vertical direction and has a plurality of gas feeding holes through which a process gas passes; and
a gas supply unit which is installed outside the chamber, is connected to the shower head, and supplies the process gas into the chamber through the gas feeding holes,
wherein the shower head comprises:
a disc-shaped center part;
a ring-shaped middle part which surrounds the center part;
a ring-shaped first edge part which surrounds the middle part; and
a ring-shaped second edge part which surrounds the first edge part and is divided into a plurality of sub-parts,
wherein the shower head functions as an upper electrode, and the electrostatic chuck functions as a lower electrode, and
wherein a width from an inner radial edge of the second edge part to an outer radial edge of the second edge part is greater than a width from an inner radial edge of the first edge part to an outer radial edge of the first edge part.

6. The system of claim 5, wherein the gas supply unit comprises:
a gas supply source which provides the process gas;
a gas distributor which distributes the process gas;
a gas supply line which connects the gas supply source and the gas distributor; and
gas distribution lines which connect the gas distributor and the center part, the gas distributor and the middle part, the gas distributor and the first edge part, and the gas distributor and the second edge part, respectively.

7. A wafer treatment system comprising:
a chamber in which an etching process is performed;
an electrostatic chuck which is installed inside the chamber and on which a wafer is mounted;
a shower head which is installed inside the chamber to face the electrostatic chuck in a vertical direction and has a plurality of gas feeding holes through which a process gas passes;
a gas supply unit which is installed outside the chamber, is connected to the shower head, and supplies the process gas into the chamber through the gas feeding holes; and
an antenna which is installed in an upper part of the chamber and equipped with a spiral coil,
wherein the shower head comprises:
a disc-shaped center part;
a ring-shaped middle part which surrounds the center part;
a ring-shaped first edge part which surrounds the middle part; and
a ring-shaped second edge part which surrounds the first edge part and is divided into a plurality of sub-parts,
wherein the antenna functions as an upper electrode, and the electrostatic chuck functions as a lower electrode, and
wherein a width from an inner radial edge of the second edge part to an outer radial edge of the second edge part is greater than a width from an inner radial edge of the first edge part to an outer radial edge of the first edge part.

8. The system of claim 7, wherein the gas supply unit comprises:
a gas supply source which provides the process gas;
a gas distributor which distributes the process gas;
a gas supply line which connects the gas supply source and the gas distributor; and
gas distribution lines which connect the gas distributor and the center part, the gas distributor and the middle part, the gas distributor and the first edge part, and the gas distributor and the second edge part, respectively.

9. The apparatus of claim 1, wherein a width from an inner radial edge of the middle part to an outer radial edge of the middle part is greater than a width from the inner radial edge of the first edge part to the outer radial edge of the first edge part.

* * * * *